United States Patent [19]
Yamazaki et al.

[11] Patent Number: 5,288,684
[45] Date of Patent: Feb. 22, 1994

[54] PHOTOCHEMICAL VAPOR PHASE REACTION APPARATUS AND METHOD OF CAUSING A PHOTOCHEMICAL VAPOR PHASE REACTION

[75] Inventors: Shunpei Yamazaki, Tokyo; Shinji Imatoh; Shigenori Hayashi, both of Kanagawa, all of Japan

[73] Assignee: Semiconductor Energy Laboratory Co., Ltd., Kanagawa-ken, Japan

[21] Appl. No.: 673,812

[22] Filed: Mar. 22, 1991

[30] Foreign Application Priority Data

Mar. 27, 1990 [JP] Japan .................................. 2-77781

[51] Int. Cl.⁵ ............................................. H01L 21/00
[52] U.S. Cl. .................................. 118/722; 118/723 E;
118/719; 118/723 MP; 156/345
[58] Field of Search ............... 156/345; 118/722, 723, 118/719, 715

[56] References Cited

U.S. PATENT DOCUMENTS

| | | | |
|---|---|---|---|
| 4,115,163 | 9/1978 | Gorina et al. | 118/723 |
| 4,654,226 | 3/1987 | Jackson et al. | 118/719 |
| 4,836,140 | 6/1989 | Koji | 118/719 |
| 4,857,382 | 8/1989 | Liu et al. | 156/643 |
| 4,974,542 | 12/1990 | Hayashi et al. | 118/722 |

FOREIGN PATENT DOCUMENTS

| | | |
|---|---|---|
| 60-050918 | 3/1985 | Japan . |
| 60-052014 | 3/1985 | Japan . |
| 60-190566 | 9/1985 | Japan . |
| 61-139022 | 6/1986 | Japan . |
| 61-160926 | 7/1986 | Japan . |
| 61-174380 | 8/1986 | Japan . |
| 62-143426 | 6/1987 | Japan . |
| 63-041015 | 2/1988 | Japan . |
| 63-253620 | 10/1988 | Japan . |
| 63-262471 | 10/1988 | Japan . |
| 1-302718 | 12/1989 | Japan . |

*Primary Examiner*—Brian E. Hearn
*Assistant Examiner*—George Goudreau
*Attorney, Agent, or Firm*—Sixbey, Friedman, Leedom & Ferguson

[57] ABSTRACT

A photochemical vapor phase reaction apparatus and a method of causing a photochemical vapor phase reaction are described. The apparatus comprises a vacuum chamber, a substrate holder provided in the vacuum chamber for holding a substrate to be treated by a vapor phase reaction, a gas feeding system for supplying a reactive gas to the reaction space, a light source housed in a light source room for emitting light rays through a light window, an optical system for condensing and projecting the light rays emitted from the light source onto the substrate on the holder. By this configuration, the intensity of light is relatively low at the light window and relatively high at the surface of a substrate to be treated.

20 Claims, 9 Drawing Sheets

PHOTOCHEMICAL VAPOR PHASE REACTION APPARATUS AND METHOD OF CAUSING A PHOTOCHEMICAL VAPOR PHASE REACTION

BACKGROUND OF THE INVENTION

1. Field of the Invention

The present invention relates to a photochemical vapor phase reaction apparatus and a method of causing a photochemical vapor phase reaction, more particularly relates to an apparatus for carrying out chemical vapor deposition and etching assisted by optical energy.

2. Description of the Prior Art

Among techniques for depositing thin films in vapor phase, photo-CVD has been well known as an excellent method which can deposit excellent quality thin films at low temperatures with little damage to the underlying surface as compared with other available CVD techniques such as thermal CVD, plasma CVD.

An exemplary conventional apparatus is shown in FIG. 1. The apparatus comprises a vacuum chamber defining a reaction (deposition) space 2 therein, an evacuating system 8 including a rotary pump 19, a reactive gas feeding system 7, a mercury bubbler 13 for activating reactive gases supplied from the gas feeding system 7, a substrate holder 1' for supporting substrates 1 thereupon, a heating means 3 for maintaining the substrate temperature at an appropriate level, and a low pressure mercury lamp 9 for irradiating the substrates through a window 10 made of a quartz plate. In the operation of the apparatus, a reactive gas such as disilane is introduced into the reaction chamber 2 after evacuating the deposition space 2 in the chamber to an appropriate pressure by means of the evacuating system 8. The reactive gas is decomposed by the optical energy of ultraviolet light emitted from the lamp 9 and leaves a thin film such as an amorphous film on the substrates 1 which are heated to 250° C. by the heating means 3.

The deposition of the product of the reaction, however, takes place also on the surface of the light window 10 so that the transparency thereof is gradually reduced as the deposition of the thin film on the substrates 1 continues. The deposited product on the window comes to absorb substantial part of the ultraviolet light and decelerates the deposition speed on the substrates 1 and eventually deposition is stopped. Accordingly, there is a limit to the thickness of films which can be formed by this method. One of the resolution of this problem is a coating 16 of Fomblin oil (fluorine-based oil) on the window for retarding the progress of the unwanted deposition. The oil coating tends, on the other hand, to get mixed within the films deposited on the substrates 1 and degrade the quality of the films deposited. Furthermore, the oil coating can not completely prevent the unwanted deposition so that a little product is deposited at a slow deposition speed, posing a similar problem of the limit to the maximum thickness of the films on the substrates 1.

BRIEF SUMMARY OF THE INVENTION

It is an object of the present invention to provide a photochemical vapor phase reaction apparatus capable of depositing high quality thin films.

It is another object of the present invention to provide a photochemical vapor phase reaction apparatus capable of depositing high quality thin films without the use of an oil coating on a light window.

It is a further object of the present invention to provide a photochemical vapor phase reaction apparatus capable of depositing high quality thin films to increased thicknesses as compared with conventional apparatus.

It is a further object of the present invention to provide a photochemical vapor phase reaction apparatus capable of depositing films at a high deposition speed.

It is a further object of the present invention to provide a photochemical vapor phase reaction apparatus capable of etching films at a high etching rate.

It is a still further object of the present invention to provide a method of causing a photochemical vapor phase reaction with high reaction speed.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, the intensity of light at the position of a light window is decreased as compared with that at the position of substrates to be coated so that the deposition on the light window is substantially retarded without decreasing the deposition speed on the substrate to be coated. Alternatively, the intensity of light at the position of films to be etched is increased as compared with that at the position of a light source so that the etching speed of the films is substantially increased. A light source is provided with an optical system adapted to condense light beams emitted from the light source and project the condensed light beams onto substrates to be coated or films to be etched. The optical system can increase the intensity of light at the substrates or the films by a factor of X/Y, if the light beam emitted from the light source having a cross sectional area of X $cm^2$ is condensed to a beam having a cross sectional area of Y $cm^2$ at the substrates or the films. By this condensation, the optical effect at the substrates or the films is relatively enhanced.

The inventors have known through experiments the fact that there is a relationship between the maximum thickness of films deposited on substrates and the distance between the substrates and the light window. The maximum thickness takes its maximal value at a certain optimum value of the distance when the pressure of the reactive gas is constant. The optimum distance ranges from 1 mm to 100 mm as the pressure of the reactive gas changes from 1 Pa to $10^6$ Pa. Namely, the thickness of films deposited can be increased by adjusting the distance at an appropriate value.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1:
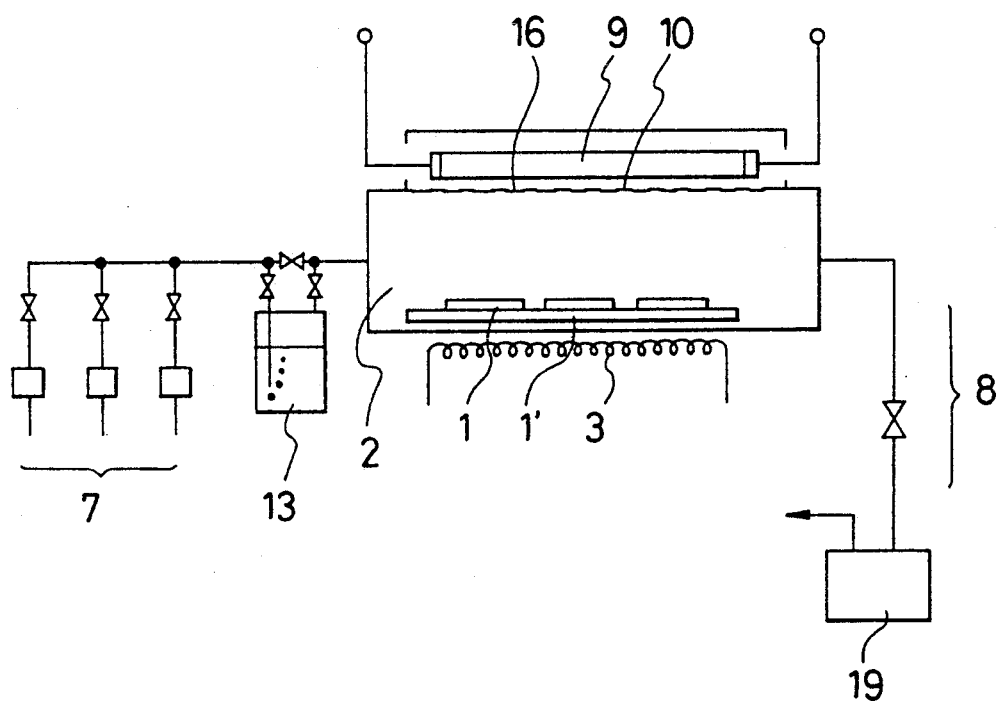
FIG. 1 is a schematic diagram showing a photochemical vapor phase reaction apparatus in accordance with the conventional photo-CVD technique.
Figure 2:
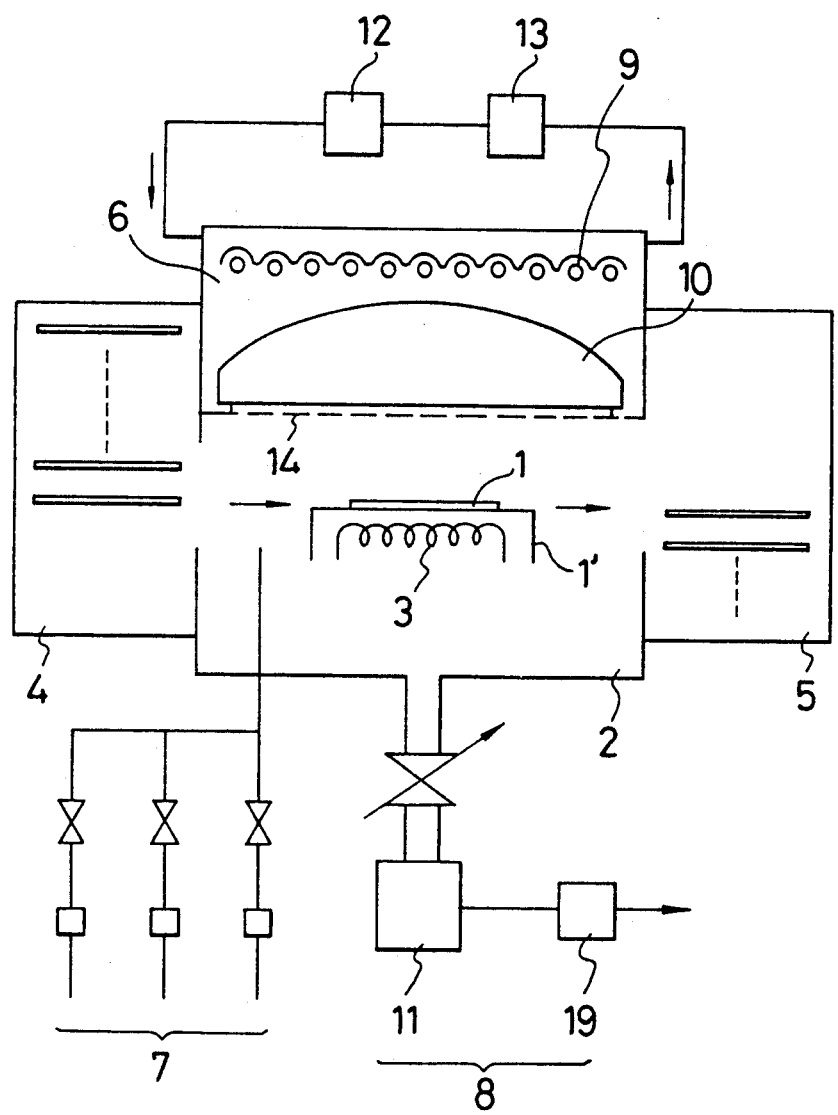
FIG. 2 is a schematic diagram showing a photochemical vapor phase reaction apparatus in accordance with a first embodiment of the present invention.

Referring now to FIG. 2, a photochemical vapor phase reaction apparatus and a photochemical vapor deposition in accordance with a first embodiment of the present invention will be explained. The apparatus comprises a vacuum chamber defining a reaction space 2 therein, an evacuating system 8 including a rotary pump 11 and a turbo molecular pump 19, a gas feeding system 7 for supplying a reactive gas and a dopant gas, a loading chamber 4 coupled with the vacuum chamber at the left side for holding a number of substrates to be treated, an unloading chamber 5 coupled with the vacuum chamber at the right side for reserving substrates having been treated, a light source 9 consisting of a plurality of low pressure mercury lamps, a light window in the form of a lens 10 which partitions the inside of the vacuum chamber in order to form a light source room 6 above the reaction space 2, a circulator 12 associated with a cooler 13 for circulating nitrogen cooled at room temperature to 50° C. through the light source room 6, and a substrate holder 1' associated with a heater 3 for holding a substrate 1 at an appropriate temperature. No oil coating is applied to the lens 10. The turbo molecular pump functions to prevent contamination from entering into the reaction space 2 through the evacuation system by reverse diffusion. The circulator 12 and the cooler 13 maintain the temperature of the mercury lamps for stabilizing the UV light emission from the lamps by circulating nitrogen cooled by the cooler 13 through the light source room 6. The light source 9 comprises 11 low pressure mercury lamps arranged in an area of 400 cm$^2$ for emission of ultraviolet rays at 185 nm wavelength. The intensity of the light source is about 1 mW/cm$^2$. The distance between the lower surface of the lens 10 and the upper surface of the substrate 1 mounted on the substrate holder 1' is adjustable between 1 mm and 100 mm. For the following exemplary process, the distance is selected to be 30 mm. In this configuration, ultraviolet rays are condensed and projected onto the surface of the substrate 1 to have a cross sectional area of 100 cm$^2$ at about 4 mW/cm$^2$ which intensity is four times the intensity at the light source 9. The lens has to sustain the differential pressure between the light source room 6 and the reaction space 2. However, when the pressure in the light source room 6 is appropriately reduced, the stress exerted on the lens can be substantially decreased.

In the operation of the apparatus, one of substrates kept in the loading chamber is transported to the vacuum chamber and mounted on the substrate holder 1'. After isolating the reaction space 2 in the vacuum chamber from the loading chamber 4 and evacuating the reaction space 2 to a vacuum of $10^{-7}$ Torr by means of the evacuating system 8, a reactive gas comprising nitrogen and disilane is leaked into the chamber 2 from the feeding system 7 to a reaction pressure of 400 Pa. At the same time, ultraviolet rays are emitted from the mercury lamps, condensed and projected onto the substrate 1 through the lens 10. As a result, deposition of a silicon nitride film is initiated on the substrate 1. In accordance with experiments, the deposition speed was 100 Å/min to 1000 Å/min which is 5 to 10 times faster than that of conventional cases, and the deposition could be continued to thicknesses as large as 5000 Å which is twice or more times greater than the maximum thicknesses of conventional techniques.

When deposition on the substrate 1 is completed, the coated substrate is transported to the unloading chamber 5 and at the same time another one of substrates in the loading chamber 4 is transported to the chamber 2 and mounted on the holder 1' followed by the deposition of a silicon nitride film on the newly disposed substrate as described above. This procedure is repeated until all the substrates in the loading chamber 4 are coated in the chamber 2 and disposed in the unloading chamber 5.

The use of the turbo molecular pump 19 is particularly desired because its capability of eliminating contamination from the chamber 2 is made effective due to the non-use of an oil coating on the light window acting as a serious contaminant so that the quality of films deposited by this apparatus is significantly improved.

In the case that light rays perpendicularly projected to the substrate to be coated, the advantage of the present invention can be more effective by flowing, along the surface of light window in the side of the reaction space 2, an inactive gas which shall not produce any solid production and influence undesirable effect to the deposition reaction.

One of the suitable application of the apparatus is the formation of dielectric films serving to form trench capacitances in integrated circuits containing DRAM of 1 Mega bites or 4 Mega bites. After formation of FETs within a semiconductor chip by a usual procedure, trenches of 3 μm width and 10 to 15 μm depth are formed to make electric contact with the drains of the FETs. The inside surfaces of these trenches are coated with a silicon nitrogen film to a thickness of about 700 Å in the above mentioned apparatus. The trenches are then filled with silicon by deposition in the apparatus in the same procedure but using disilane alone as a reactive gas followed by etching repeated to form capacitances for the DRAM.

Figure 3:
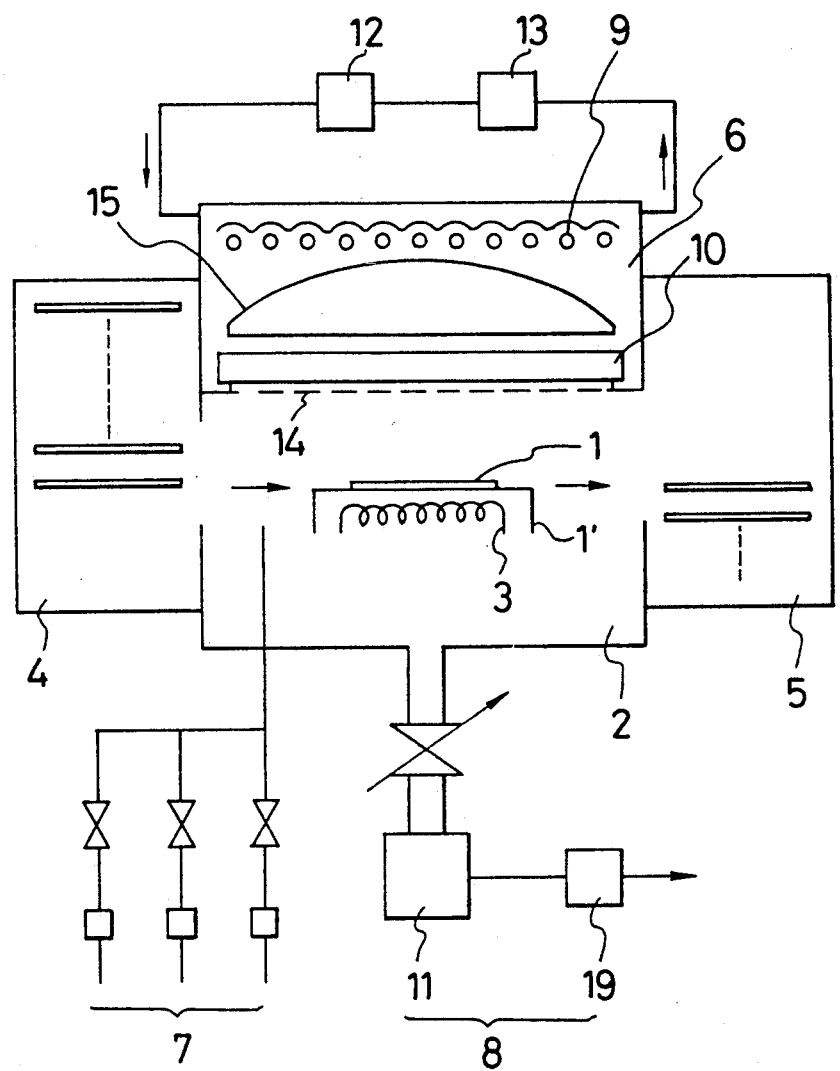
FIG. 3 is a schematic diagram showing a photochemical vapor phase reaction apparatus in accordance with a second embodiment of the present invention.

Referring next to FIG. 3, a photochemical vapor phase reaction apparatus and a photochemical vapor deposition in accordance with a second embodiment of the present invention will be explained. In this embodiment, a lens 15 is provided, independent of a light window 10, between the light source 9 and the window 10. The position of the lens 15 can be adjusted by means of an adjustment mechanism (not shown in the figure) in order to change the condensation degree of light at the substrate surface in correspondence with the size of the substrate 1. Other configuration and elements are identical to those in the first embodiment and therefore redundant explanation will be dispensed with. In this case, since the lens can be formed only to have a function to condense light rays but no particular mechanical strength, the preparation thereof becomes significantly easy as compared with that of the first embodiment. The differential pressure between the light source room 6 and the reaction space in the chamber 2 is sustained by the light window 10.

Figure 4:
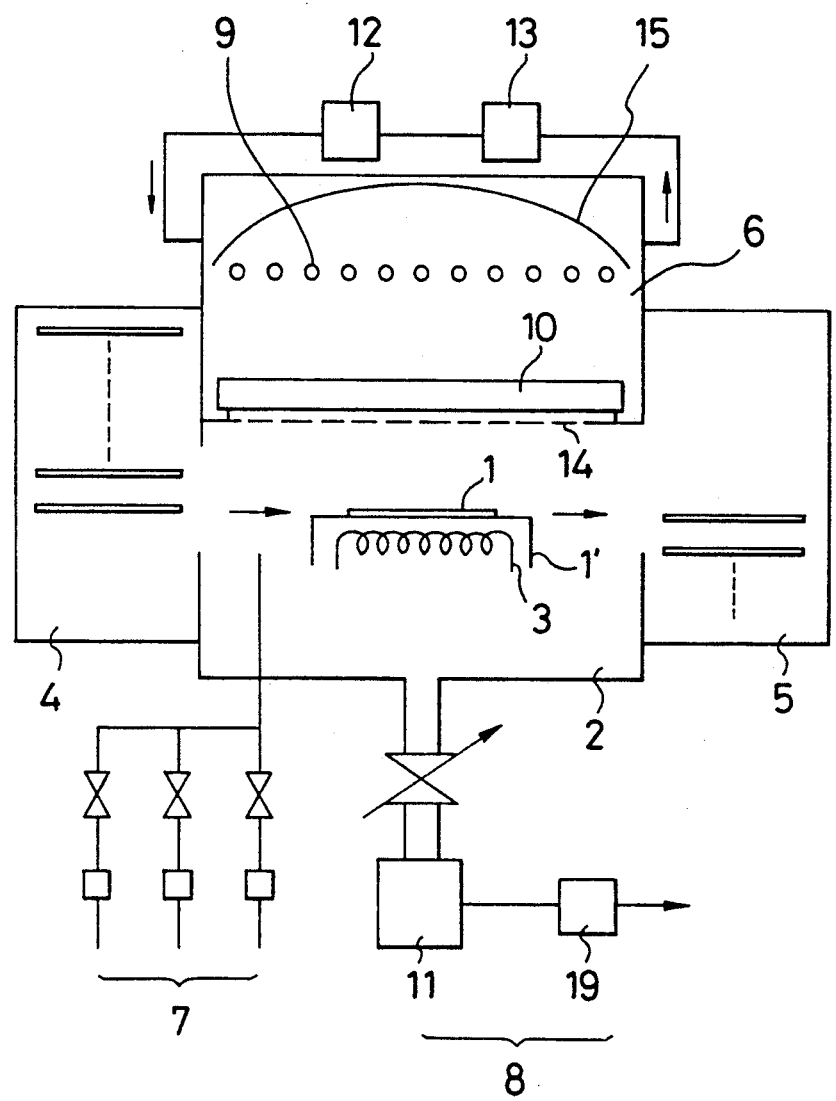
FIG. 4 is an explanatory view showing a photochemical vapor phase reaction apparatus in accordance with the present invention.

Referring next to FIG. 4, a photochemical vapor phase reaction apparatus and a photochemical vapor deposition in accordance with a third embodiment of the present invention will be explained. In this embodiment, a concave mirror 15 is provided as a condensing means, instead of a lens, in the rear side of the light source 9. Other configuration and elements are identical to those in the second embodiment and therefore redundant explanation will be dispensed with. In this case, the mirror can be formed only of an inexpensive metal. The light rays incident upon the substrate 1, however, are both the rays reflected from the mirror and the rays directly reaching the substrate from the light source 9 so that the differential intensity between the light rays at the light window 10 and the light rays at the substrate surface is not so large as compared with the first and second embodiments.

The above procedure of photochemical reaction can be employed for etching by the use of either of the apparatuses illustrated in FIGS. 2, 3 and 4 except those described in the followings as a typical embodiment with reference to FIGS. 5(A) to 5(M).

Referring now to FIGS. 5(A) to 5(M), a method for manufacturing a thin film transistor suitable for use in the driving circuits of liquid crystal displays in accordance with a fourth embodiment of the present invention will be described. A 2000 Å thick non-single crystalline silicon intrinsic semiconductor film 1-2 is deposited on a sodalime glass substrate 1-1 by a known plasma CVD method. The substrate temperature, the reaction pressure, the RF power (13.56 MHz) during deposition are 350° C., 0.06 Torr and 100 W respectively. The reactive gas used is $SiH_4$.

Figure 5A:
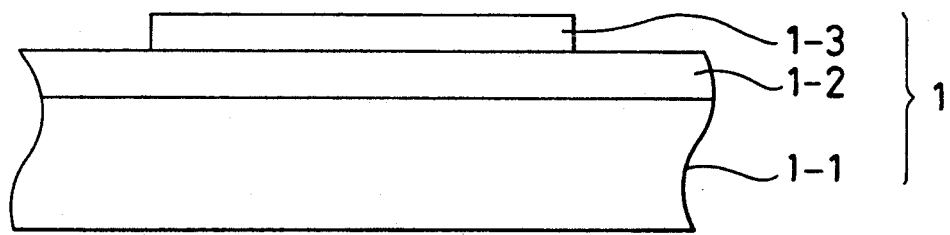
FIGS. 5(A) to 5(M) are cross sectional diagrams showing an etching method in accordance with the present invention.
Figure 5B:
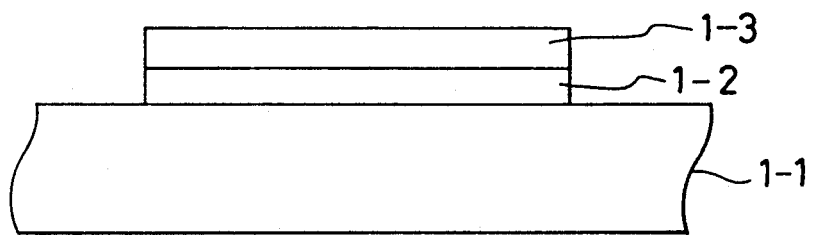
Figure 5C:
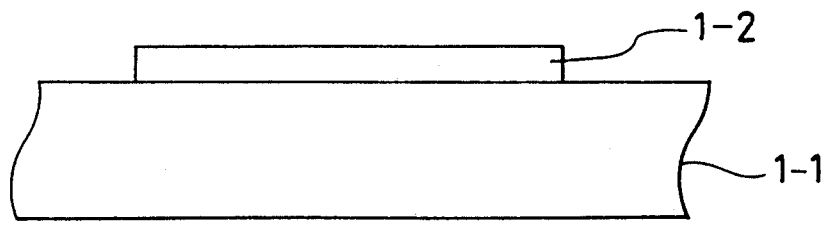

After providing a suitable photoresist pattern 1-3 on the semiconductor film 1-2, the semiconductor film 1-2 on the substrate is disposed and subjected to etching action in the apparatus illustrated in FIG. 2. The procedure in the apparatus is substantially identical to the procedure for deposition as described above except those described herein. The reactive gas used is an etchant gas supplied from the gas introduction system 7. The etchant gas is a chloride gas, for example $Cl_2$. The pressure of the gas is 100 mm Torr in the apparatus. The substrate temperature is selected to be −30° C. to room temperature. The light source 9 comprises 11 low pressure mercury lamps arranged in an area of 400 cm² for emission of ultraviolet rays at 185 nm wavelength and the intensity of the light source is about 1 mW/cm². The ultraviolet rays are condensed and projected by the lens 10 onto the semiconductor film 1-2 to have a cross sectional area of 100 cm² at about 4 mW/cm² which intensity is four times the intensity at the light source. As a result, etching action takes place by virtue of ultraviolet light supplied from the mercury lamp and focussed on the semiconductor film 1-2 by means of the lens 10. In accordance with experiments, the etching speed was 100 to 500 Å/min, which is 5 to 10 times higher than that of conventional apparatuses. Then, the semiconductor film 1-2 is patterned as illustrated in FIG. 5(B). The unnecessary photoresist pattern 1-3 is removed as shown in FIG. 5(C).

Figure 5D:
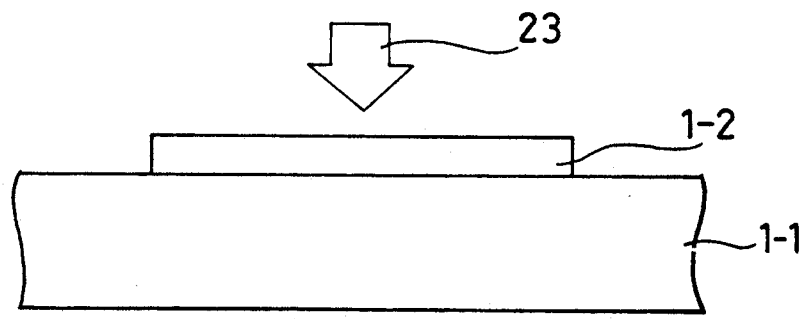
Figure 5E:
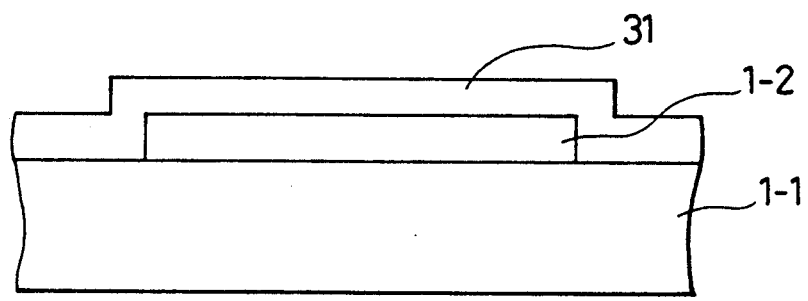

The semiconductor film 1-2 is then irradiated with ten pulses of a laser beam 23 emitted from an excimer laser (KrF) in order to recrystallize the semiconductor film 1-2 as shown in FIG. 5(D) in a single crystalline structure having almost the same size of the patterned film 1-2 or in a polycrystalline structure consisting of relatively large grains. The wavelength of the laser pulse is 284 nm. The energy of the irradiation is 200 mJ/cm². The pulse width is 30 nano second. An n-type non-single crystalline semiconductor film 31 is next deposited to a thickness of 500 Å conformly on the substrate 1-2 over the semiconductor film 1-2 by a known plasma CVD as shown in FIG. 5(E). The reactive gas is $SiH_4$ and $PH_3$ diluted by $H_2$ supplied from the gas introduction system 7. The pressure of the gas is 0.05 Torr in the apparatus. The substrate temperature is selected to be 250° C. The RF power (13.56 MHz) is 150 W. As a result, the semiconductor film 31 is deposited in microcrystallie structure by virtue of the high RF energy and the much amount of $H_2$ so that the resistivity of the film 31 is low.

Figure 5F:
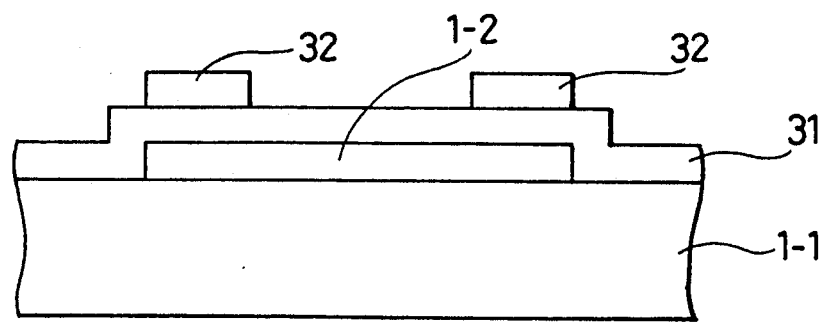
Figure 5G:
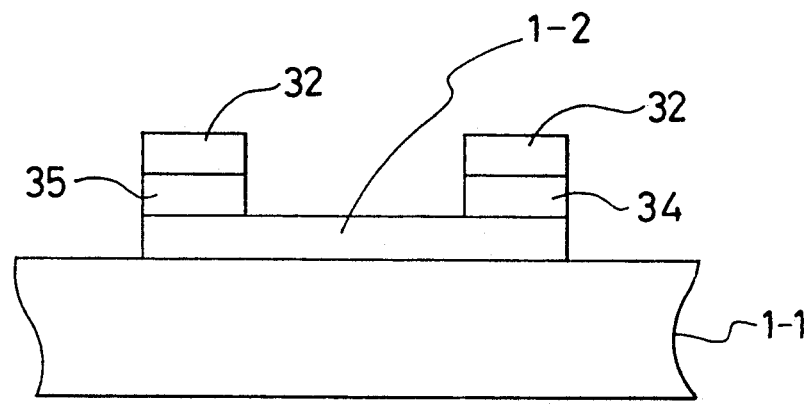
Figure 5H:
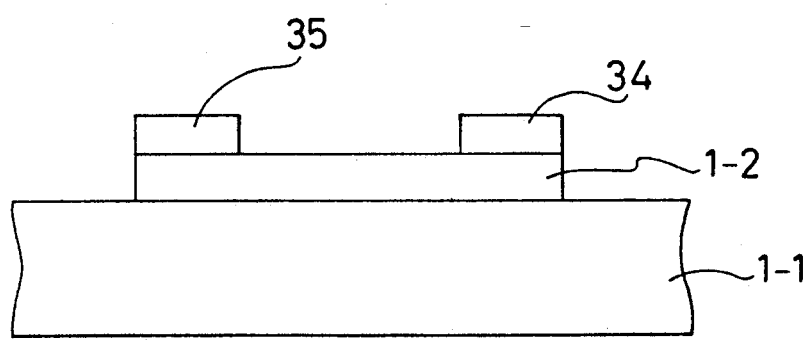
Figure 5I:
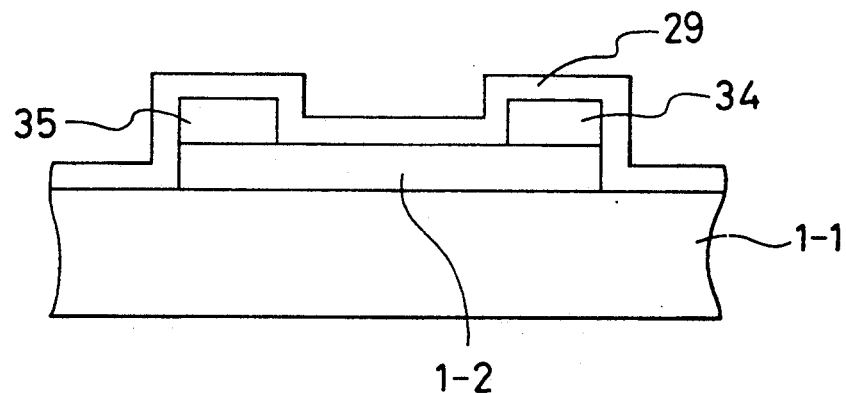
Figure 5J:
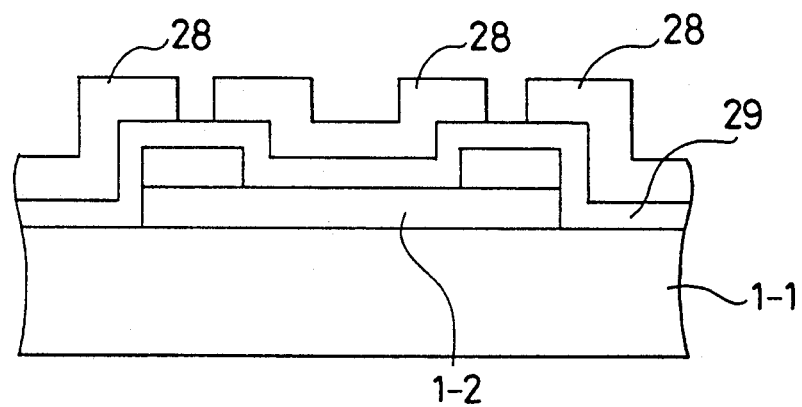
Figure 5K:
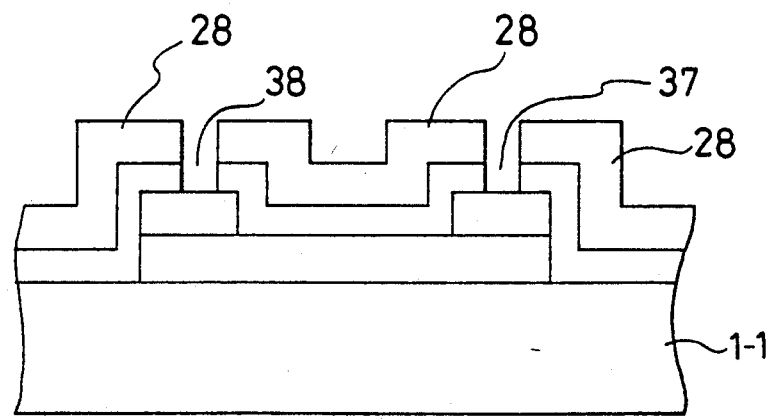
Figure 5L:
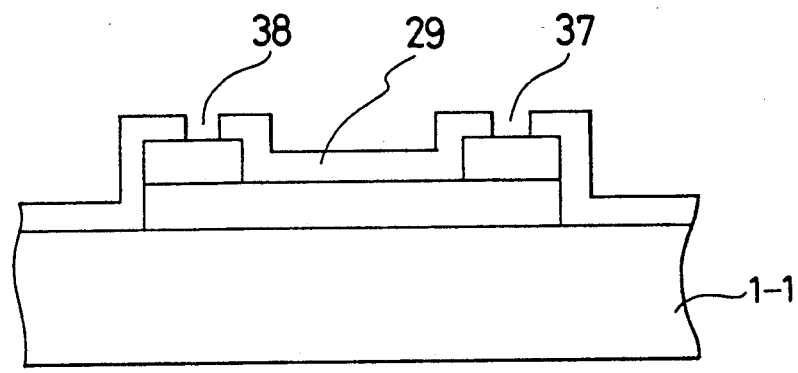
Figure 5M:
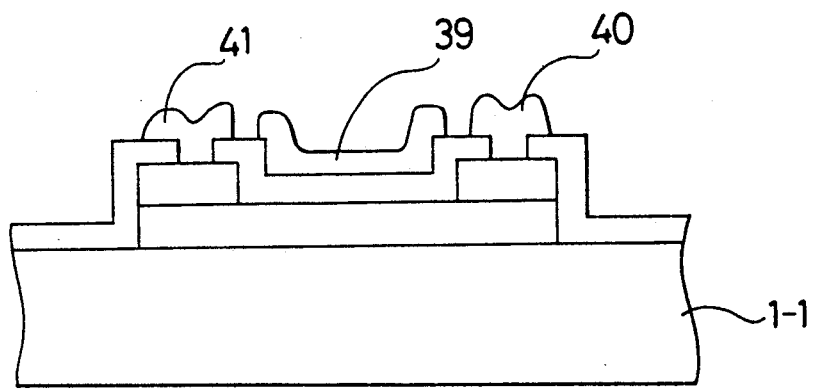

The semiconductor film 31 is then etched as shown in FIGS. 5(F) and 5(G) with a photoresist pattern 32 in the apparatus shown in FIG. 2 by the same procedure as the intrinsic semiconductor film 1-2 as described above. The etching speed in this case is 100 to 1500 Å/min. By removing the photoresist pattern 32, a source and a drain region 34 and 35 are formed on the intrinsic semiconductor film 1-2 as shown in FIG. 5(H). A gate insulating film 29 is deposited conformly over the structure to a thickness of 700 Å by RF sputtering. The substrate temperature, the reaction pressure, the RF power during deposition are 100° C., 0.5 Torr and 500 W respectively. The target is made of $SiO_2$ (99.99%). The background atmosphere is pure oxygen. The distance between the target and the substrate surface is selected to be 150 mm. In accordance with experiments, the dielectric strength and the interface state of the gate insulating film 29 were 9.1 MV/cm and $2.5 \times 10^{10} eV^{-1} cm^{-2}$ respectively. The gate insulating film 29 is etched with a photoresist pattern 28 as shown in FIG. 5(J). The etching is carried out by the use of a mixed solution consisting of HF and $NH_4F$ ($HF:NH_4F = 1:7$ to $1:10$). The etching speed is 500 to 4000 Å/min. As a result, contact holes for the source and the drain are formed (FIG. 5(K)) followed by removal of the photoresist pattern 28 (FIG. 5(L)). Finally, source, drain and gate electrodes 40, 41 and 39 are formed by depositing aluminum as illustrated in FIG. 5(M).

In accordance with this embodiment, etching speed is improved since intensity of ultraviolet rays is made higher by lens at a film to be etched than at a light source thereof. Instead, parallel rays may be projected for etching onto a film to be etched in a direction perpendicular to the surface of the film. Such parallel rays can be obtained by condensing rays, for example ultraviolet rays, emitted from a light source in an apparatus of the present invention. The condensation is carried out by a suitable lens or concave mirror. Etching speed of this etching is slower than the etching speed in the case of the etching as described in the fourth embodiment. However, a groove having am sidewall perpendicular to a film surface is made in the film by etching by virtue of parallel rays.

It should be noted again that other reaction conditions not particularly described in the above for etching are identical to those for the first embodiment for deposition. The etching procedure can be carried out also by the use of the apparatuses shown in FIGS. 3 and 4 in the same manner.

The above embodiments have been presented for the purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

For example, a multi-chamber system can be assembled with a plurality of chambers each of which is constructed in the same manner as the chamber associated with the light source room for continuous deposition of a plurality of films on a substrate throughout the system. Of course, the apparatus can be joined to other reaction apparatuses, such as those for etching, sputtering or others arranged together with the apparatus of the present invention between the loading and unloading chambers 4 and 5 in order to carry out complicated processes without removing substrates from the apparatus. This is particularly suitable for production of LSIs containing DRAMs. A plurality of such chambers can be arranged in a line or a circle with a center of loading and unloading chambers in such multi-chamber systems. When joined with a chamber for plasma deposition, the apparatus can be used for depositing relatively thick films at a high deposition speed. Namely, the surface of a substrate is first coated with a high quality thin film by the photo-CVD without damage (sputtering) to the underlying surface in accordance with the present invention followed by deposition (thickening) process in the chamber for plasma CVD. This can be accomplished also in a one-chamber apparatus as shown in FIGS. 2 to 4 by providing a meshed electrode 14. Plasma CVD can be carried out after photochemical CVD without moving a substrate by applying high frequency electric energy at 13.56 MHz between the electrode 14 and the substrate holder 1' to initiate plasma deposition. The plasma reaction can be carried out for the purpose of plasma etching to eliminate flakes attached to the inside of the chamber 2 after deposition. In this case, $NF_3$ can be used as an etchant gas. The apparatus in accordance with the present invention can be applied to deposit a variety of materials. By use of reactive gases in the form of $M(CH_3)_n$, where M is Al, In, Sn, Cr, Mo, Ga or W, metal films can be formed. Silicide films of these metals such as $MSi_3$ can be also deposited by introducing suitable silicon gaseous compounds in addition to such reactive gases comprising metals. Nitride films of these metals such as AlN can be also deposited by introducing suitable nitrogen gaseous compounds in addition to such reactive gases comprising metals. Furthermore, carbonyl compounds of iron, nickel and cobalt can be used to deposit iron, nickel and cobalt films or their compound films. The photochemical reaction of the present invention can be carried out for the purpose of etching to remove or pattern a film provided on a substrate. In this case, fluoride compounds such as $CF_4$, $NF_3$ or chloride fluoride compounds such as $ClF_3$ can be used as an etchant gas.

What is claimed is:

1. A photochemical vapor phase reaction apparatus comprising:
   a reaction space;
   a gas feeding system for supplying a reactive gas to said reaction space;
   a light source for emitting light rays, said light source being provided in a light source room separated from said reaction space by a light window in an air-tight manner;
   a substrate holder for holding a substrate in said reaction space;
   means for condensing and projecting the light rays emitted from said light source onto said substrate on said holder in order to cause a photochemical vapor phase reaction to said reactive gas in said reaction space, and
   a mechanism for adjusting the distance between said light ray condensing means and said substrate by changing the location of said light ray condensing means to vary its distance from the substrate holder and thereby changing the extent to which the light rays are condensed as they travel from the light ray condensing means, through the light window, onto said substrate.

2. The photochemical vapor phase reaction apparatus as claimed in claim 1 wherein said condensing means is a convex lens.

3. The photochemical vapor phase reaction apparatus as claimed in claim 1 further comprising a heater provided for heating said substrate holder.

4. The photochemical vapor phase reaction apparatus as claimed in claim 1 wherein said photochemical vapor phase reaction is a photochemical vapor deposition.

5. The photochemical vapor phase reaction apparatus as claimed in claim 1 wherein said photochemical vapor phase reaction is an etching.

6. The photochemical vapor phase reaction apparatus as claimed in claim 1 wherein said light source is a UV lamp.

7. The photochemical vapor phase reaction apparatus as claimed in claim 1 wherein said light source room and said reaction space are formed by partitioning a vacuum chamber by said light window.

8. The photochemical vapor phase reaction apparatus as claimed in claim 1 further comprising a circulation means for circulating a gas through said light source room.

9. The photochemical vapor phase reaction apparatus as claimed in claim 8 further comprising a cooler associated with said circulation means for cooling said gas circulated through said light source room.

10. The photochemical vapor phase reaction apparatus as claimed in claim 1 further comprising a pressure control means for controlling a pressure of said light source room.

11. The photochemical vapor phase reaction apparatus as claimed in claim 10 wherein said pressure can be maintained at an atmospheric pressure.

12. The photochemical vapor phase reaction apparatus as claimed in claim 1 further comprising an electrode provided opposed to said holder for carrying out plasma reaction by supplying electric energy therebetween.

13. The photochemical vapor phase reaction apparatus as claimed in claim 12 wherein said electrode is a meshed electrode.

14. The photochemical vapor phase reaction apparatus as claimed in claim 12 wherein said electric energy is supplied at a high frequency.

15. The photochemical vapor phase reaction apparatus as claimed in claim 1 further comprising an evacuation system for evacuating said reaction space.

16. The photochemical vapor phase reaction apparatus as claimed in claim 15 wherein said evacuation system includes a turbo molecular pump.

17. The photochemical vapor phase reaction apparatus as claimed in claim 1 further comprising a loading chamber for keeping a plurality of substrates to be sequentially treated in said reaction space.

18. The photochemical vapor phase reaction apparatus as claimed in claim 1 further comprising an unloading chamber for storing a plurality of substrates having been treated in said reaction space.

19. A photochemical vapor phase reaction apparatus comprising:

an evacuation chamber;

a substrate holder for supporting a substrate in said evacuation chamber;

a gas feeding system for supplying a reactive gas to said chamber;

a light source chamber directly connected to said evacuation chamber where said light source chamber is isolated from said evacuation chamber by a light window;

a UV lamp provided in said light source chamber for emitting light rays into said evacuation chamber through said light window; and a means for circulating a gas in said light source chamber for cooling said UV lamp, wherein said light window is a convex lens so that said light rays are condensed in said evacuation chamber and wherein said convex lens has a flat surface on the evacuation chamber side and a convex surface on the light source chamber side.

20. A photochemical vapor phase reaction apparatus according to claim 19, wherein said convex lens is a single convex lens.

* * * * *